United States Patent [19]

Goldberg

[11] 4,401,750
[45] Aug. 30, 1983

[54] ETCHED PHOTOGRAPHIC IMAGERY

[76] Inventor: Jerrold Goldberg, 1313 N. 84th Pl., Scottsdale, Ariz. 85257

[21] Appl. No.: 321,768

[22] Filed: Nov. 16, 1981

[51] Int. Cl.³ .............................................. G03C 5/00
[52] U.S. Cl. .................................... 430/323; 430/324; 430/5; 430/396; 156/633; 156/659.1
[58] Field of Search .................... 430/323, 5, 320, 396, 430/494, 951; 156/663, 633, 659.1

[56] References Cited

U.S. PATENT DOCUMENTS

| 3,205,155 | 9/1965 | Natter | 156/656 |
| 3,642,476 | 2/1972 | Mesley | 430/5 |
| 3,759,753 | 9/1973 | Becca et al. | 148/6.3 |
| 4,110,114 | 8/1978 | Sato | 156/633 |
| 4,253,910 | 3/1981 | Mason et al. | 156/633 |

OTHER PUBLICATIONS

James, T. H. and Higgins, G. C., "Fundamentals of Photographic Theory," Morgan and Morgan, Inc., New York, 1968, pp. 268-269.

Eastman Kodak Company, Editor, "Encyclopedia of Practical Photography," vol. 7, Flo-gum, Amphoto, New York, 1978, pp. 1243-1251.

Primary Examiner—John E. Kittle
Assistant Examiner—José G. Dees
Attorney, Agent, or Firm—James F. Duffy

[57] ABSTRACT

A method using a relatively coarse grained film photographic image produces a photo etched image having photographic-print-quality in that the image displays gradations of contrast throughout representative of light, shadow and contour. The visual effect is that of an image reproduced by use of halftone cuts. The difference, however, lies in that halftone imagery is produced by component particles of uniform size whereas the granular structure of the coarse grained photographic image on the film is more random in nature.

16 Claims, No Drawings

ETCHED PHOTOGRAPHIC IMAGERY

BACKGROUND

1. Field of the Invention

The invention relates to the field of photo etching techniques.

Specifically, the invention relates to methods for producing photographic-print-quality image reproductions having a range of image contrast gradations throughout by an etching process.

In particular, the invention relates to the products produced by the etching techniques provided for by said methods.

2. Prior Art

The etching of glass and other materials to provide ornamented articles is well known in the prior art. Various means of producing images in glass and metals have been utilized. Typically, these variations depend upon the particular article of manufacture, the design or ornamentation desired, and the overall affect to be created.

Frederecici, U.S. Pat. No. 154,032; Bradley, U.S. Pat. No. 243,200; Stern, U.S. Pat. No. 322,864; Paini, U.S. Pat. No. 343,889; Freidrich, U.S. Pat. No. 1,205,728; Kueffel et al, U.S. Pat. No. 2,374,356; Maleyre, U.S. Pat. No. 2,530,436; and Becca et al, U.S. Pat. No. 3,759,753 teach various methods for defining an image on a surface. Such methods include the use of stenciling or other means of patterning a design upon an object, applying a protective resist substance and then etching the object.

Others skilled in the prior art have taught the use of photo resist materials, processed in either a positive or negative mode, to define the desire image. Typical examples of such teaching will be found in Spitzer, U.S. Pat. No. 865,276; Ross, U.S. Pat. No. 2,094,432; Van Natter, U.S. Pat. No. 3,205,155; and Mesley, U.S. Pat. No. 3,642,476.

Unfortunately, from an artistic point of view, all of the known methods providing etched ornamentation yield sharply defined outlines with no contrast gradations as would be provided in a photographic-print-quality image. Most such etched ornamentation provides imagery which may be best defined as analogous to silhouettes of the objects depicted.

Cheney in U.S. Pat. No. 2,036,021, issued March, 1936, teaches the manufacture of ornamental coated glass articles. His teachings are directed to methods for obtaining sharply defined outlines of the image depicted by preventing undercutting of the etched surface by the etchant materials employed.

While not an etching process per se, Harmon in U.S. Pat. No. 1,971,261, issued Aug. 21, 1934, teaches a method for making ornamental mirrors wherein the ornamentation is presented in a contrasting color to that of the background mirrored surface. Thus, Harmon coats a transparent base material wih a photo resist, uses a photographic negative to impress a latent image on the photo resist, and then develops the photo resist in a staining developer bath. The photo resist remaining depicts the image transferred from the photographic negative in the color infused into the developing bath. A silver or other precipitated coating is then deposited over the photo resist image to produce a mirror on which the photo resist imagery may be viewed through the transparent base material.

In an attempt to achieve contrast gradations throughout the etched ornamental imagery, Ko et al in U.S. Pat. No. 2,731,333 issued Jan. 17, 1956, teaches a method whereby two or more metal layers are deposited on a non-metal base. Each metal layer differs from the others in color and etching characteristics. A plurality of etching operations permits etching through different layers of the metals to provide a picture of contrasting colors produced by the differing colored metal layers exposed.

Perhaps the ultimate in approaching photographic quality of ornamentation is approached by Mason et al in U.S. Pat. No. 4,253,910, issued Mar. 3, 1981, which discloses an ornamental mirror and apparatus and method for making same. Here, the metallic metal backing of the mirror is etched to produce a clear, non-reflective area in the transparent base material of the mirror. This area defines the outline of an ornamental object. An actual image of the object so outlined is then positioned so as to be viewed through the resultant transparent area so outlined. The reproduction may be applied to the transparent base by a silk screen process or by the mere imposition of a photographic image which is viewed through the transparent base material of the mirror.

None of the methods known for producing etched ornamental imagery provides an etching of photographic-print-quality having a range of image contrast gradations throughout.

It is therefore an object of the present invention to produce etched imagery of such photographic-print-quality.

It is a specific objective of the invention to provide the methodology whereby an etchable surface may be etched to produce a photographic-print-quality image having a range of image contrast gradations throughout.

It is a particular object of the invention to provide articles of manufacture comprising etched photographic imagery produced by the methods disclosed.

SUMMARY OF THE INVENTION

The method of producing photographic-print-quality imagery reproductions having a range of image contrast gradations throughout by means of etching comprises the steps of selecting a base material which has a suitable surface for etching. The etchable surface is then coated with a photo resist material. Light is projected onto the photo resist coating by passing the light through a film photographic image selected to have a sufficient image granularity to produce a comparatively coarse grained, latent image in the photo resist coating. This latent image is coarse grained relative to the fine grade standards of the photographic arts. After exposure to light, the photo resist coating is treated to remove from the etchable surface all of the photo resist except such as will comprise the desired, etchant resistant, latent image. The etchable surface is then etched to produce an etched photographic image on that surface. The image will display a range of image contrast dependent upon the degree of image granularity of the film photographic image utilized in first exposing the photo resist coating to light. The base material having an etchable surface may comprise a transparent material, such as, for example, glass.

Alternatively, the base material may comprise a material on which a metallic substrate has been deposited to provide the etchable surface. In this latter case, the base material may be either transparent or a material having a color which contrasts with that of the metallic substrate.

In either case, the step of etching the surface with the metallic substrate reveals the base materials in selected areas of the etched photographic image. When a transparent base material is utilized, the etched metallic substrate may be coated with a protective material of a color contrasting with that of the metallic substrate and the etched image viewed through the transparent base material. In this latter instance, the methods taught provide that the metallic substrate deposited on the transparent base material may be such as to provide a mirror reflective interface between the transparent base material and the metallic substrate. Thus, an ornamented mirror is provided as the product from practicing the method.

The film through which light is projected onto the photo resist coating may have either a positive or a negative photographic image thereon. Practice of the methods disclosed will produce photographic-print-quality imagery by etching on a etchable surface, for example, where the etching is performed on the transparent base material itself as on glass; products wherein the etching is performed on a metal substrate on a transparent base material; manufactures wherein the etching is performed on a reflective substrate of a transparent base material to provide a mirror photographic image; and products wherein the etching of the photographic-print-quality imagery is performed on a metal substrate so as to reveal a base material of a contrasting color to the metal substrate.

DETAILS OF THE INVENTION

Because etching processes are so well known and documented in the prior art, full disclosure of the methodology of the present invention may be had without the necessity of referring to drawings. Thus, no drawings have been provided herewith.

Photo etching may be defined as the process whereby an etchable surface is coated with a photo resist which is later exposed to light to define within the photo resist coating a latent image of the imagery contained on the photographic film. In manner well known, the exposure of the photo resist material may be made with the photographic film in direct contact with the photo resist or by the projection of light through the photographic image onto the photo resist using a photographic enlarger to project the image onto the photo resist. This process of coating an etchable surface with a photo resist, exposing the photo resist to light projected through a photographic film and subsequent development of the photo resist to remove those areas of the photo resist not required to provide an etchant resistant coating will be known to those skilled in the art as a photo resist, cold top enamel process.

After treatment of the photo resist coating to remove the undesired portions thereof from the etchable surface, that surface is then etched to reproduce the imagery contained on the photographic film.

The resultant imagery produced by prior art methodology is characterized as providing no contrast gradations within the etched imagery produced. Thus, the imagery produced by prior etching techniques are essentially silhouettes having uniform contrast throughout without gradations of tone or contour within the imagery.

Hand etching techniques wherein the etching produced is constantly controlled throughout the etching process by the artist are known. In such processes, the artist controls the direction of the etched lines defining the imagery as well as the degree of etching to which such lines are subjected. No such intimate control of the etching process to produce contour and shadow is known in the conventional photo etching arts.

At this point, it might be well to consider the process by which the image on the photographic film is formed. The photographic process may be defined as the set of procedures by which a latent, or invisible, image produced when a photographic film is exposed to light, is made into a permanent visible image. An emulsion holding grains of photosensitive chemical compounds called silver halides is spread over a film or other material. Light coming through the camera lens from an object being photographed strikes certain areas of the film, rendering the silver halide grains in those areas unstable. This creates an invisible, or latent, image of the object on the film. The areas of the latent image that received the most light contain the largest number of unstable grains. Upon development, they become the darkest areas of the visible image. Conversely, areas that receive little light form the bright parts of the visible image. Because of this reversal of dark and bright areas, the visible image is often called a negative.

The most common method of making the image visible is to bathe it in a chemical developer. This contains an agent that reduces the unstable silver halide grains to black metallic silver, which forms the image. In addition to the reducing agent, the developer contains elements to control the rate of development and to keep the unexposed silver halide from fogging the film. A developer is generally designed to be used with particular film emulsions and to produce certain desired effects, such as fineness of grain in the finished image.

Fineness of grain in the finished imagery is the accepted standard in the photographic arts. Images of high granular content are generally deemed undesireable except for those few instances where the photographer/artist uses high granularity imagery to achieve a desired artistic response on the part of the viewer.

It has been discovered that, by avoiding the fine grain standards of the photographic arts and utilizing a photographic film having thereon a relatively coarse grain image structure, photographic-print-quality imagery may be produced by etching an etchable surface and the imagery produced will have a range of contrast gradations throughout. The affect on the viewer of the etched photographic imagery produced by the methods disclosed herein is that of viewing a photograph produced by halftone photoengraving techniques. However, in halftone photoengraving reproductions, the image is produced by projecting it through a wire or glass screen having lines of uniform spacing. In a coarse grained photographic image, the granules comprising the image are of random size and thus, while the gradations of contrast representative of light, shadow and contour are present in etchings produced by photo etching techniques utilizing such coarse grained photographic images, the distractive uniformity of the dot pattern produced by halftone techniques are avoided.

Various techniques are available to the photographer for producing relatively coarse grain film images. These techniques include the initial choice of film emulsion, the type of developer employed, the temperature of the developer bath, the ratio in which the component parts of a given commercial developer are mixed, etc.

Methods for etching glass, metals, and other materials are well known to those in the etching arts. Most of these etching techniques lend themself to the production of photo etched imagery by use of a photo resist coating in which a latent image is produced by exposing the coating to light through a photographic film. In accordance with the teachings herein, exposing that photo resist coating through a film image of relatively coarse granularity, compared to the fine grain standards of the photographic arts, will produce a photo etched image of photographic-print-quality having a range of image contrast gradations throughout.

Photographic-print-quality imagery may be produced by etching on any etchable surface. The etching may be carried out on the etchable surface of the base material itself, such as etching on glass. The etching may be provided by subjecting a metal substrate borne by a base material to an etchant bath.

The base material may be transparent or opaque. Where a transparent base material is provided, the operator is offered the choice of providing a reflective substrate to be etched to provide the photographic-print-quality imagery as ornamentation on a mirror. A particularly striking product is produced when the photographic image of a person is etched into the reflective surface of a mirror. The product produced by the method may be denoted a "mirror photograph". A protective covering may be placed over the etched metallic substrate and the coloring of the material may be chosen to provide a contrast with the metallic substrate when the imagery is viewed through the transparent base. Thus, a rather natural looking mirror photograph is produced by coating the etched reflective substrate with a protective layer of white enamel.

An etched photographic product may also be produced by the methods espoused here by etching a metal substrate which is borne by a base material having a contrasting color with the color of the metallic substrate. The etching of the image is such as to reveal the underlying base material whether the imagery is to be viewed through the base material or the etched substrate is to be viewed directly.

As a first step in practicing the method of the invention, a base material is selected which has a surface which is suitable for etching. The etchable surface may comprise an actual surface of the base material itself as would be the case if the base material were glass and it was desired to etch a photographic image in the glass surface. However, the etchable surface of the base material might very well comprise a metallic substrate which has been applied to the base material by deposition or heat and pressure or the like in manner well known to the prior art.

Having selected the base material and chosen the surface on which the image is to be etched, the etchable surface is coated with photo resist. The photo resist is exposed by projecting light through a film photographic image onto the photo resist. The film photograhic image is selected to have sufficient image granularity to produce a comparatively coarse grained latent image in the photo resist relative to the fine grain standards of the photographic arts. Those skilled in the art are aware that while granularity and graininess are often used interchangably by those skilled in the art, and graininess is depicted as a subjective evaluation on the part of the viewer, graininess desciptors have been set forth which accord degress of graininess with classifications of measured granularity values. To this end the *Encyclopedia of Practical Photography*, edited and published by Eastman Kodak Company, copyright 1978, provides the tabulation set forth here in part as follows:

| Diffuse rms Granularity Value | Graininess Classification |
|---|---|
| 45, 50, 55 | Very Course |
| 33, 36, 39, 42 | Course |
| 26, 28, 30 | Moderately Course |
| 21, 22, 24 | Medium |
| Less than 5-20 | Micro Fine-Fine. |

The photo resist is then treated to develop the desired etchant resistant latent image.

The surface is then etched in any suitable, well known manner to produce an etched photographic image on that surface. The resultant photographic image will display a range of image contrast determined by the degree of image granularity of the film photographic image used in exposing the photo resist coating to light.

The product produced by the methodology just set forth will provide a photographic-print-quality image having gradations of contrast throughout indicative of light, shade, and contour of the original object photographed.

Where the base material chosen is provided with a metallic substrate into which the photographic image is etched to the extent of revealing the base material, the resultant etched photographic image may be viewed from either side of the base material when that base material is transparent. The base material may be selected to have a color which contrasts with the coloring of the metallic substrate. If the base material is selected from existing opaque material stocks, the etched image of course must be viewed from the side of the base material upon which the metallic substrate had been deposited.

In following these latter steps of the methodology, products such as etched photographic images in a metal substrate on a transparent base are produced as well as products etched in a metal substrate to reveal a base material of contrasting color.

Where the base material having a metallic substrate thereon is chosen from existing transparent base materials, the metallic substrate may be chosen so as to provide a reflective mirror interface between the metallic substrate and the transparent base material when viewed through the base material. A product produced by practice of this technique will be a mirror photograph which will be enhanced by the further step of covering the metallic substrate with a protective covering of a color which contrasts with the mirrored background.

Where the step of selecting the base material involves selecting a transparent base material which itself is etchable, as for example, glass, the product produced by etching a photographic image thereon is a transparent object ornamented by an etched photographic-print-quality image which image has a range of image contrast gradations throughout. This transparent object may be further modified by the step of covering the etching to provide a background for the etched photograph when viewed through the transparent base material. A further modification of the resultant product results when the covering material provided results in the production of a mirror reflective interface between the transparent base material and the background covering material.

What has been disclosed is the method for using a relatively coarse grained film photographic image to produce a photo etched image having photographic-print-quality in that the image displays gradations of contrast throughout representative of light, shadow and contour. The visual effect is that of an image reproduced by use of halftone cuts. The difference, however, lies in that halftone imagery is produced by component particles of uniform size whereas the granular structure of the coarse grained photographic image on the film is more random in nature.

Claims are here laid to the methodology of practicing the invention and to the products produced by such practice. Those skilled in the art will conceive variations in the methodology and the products so produced which variations and resultant products are drawn from the teachings herein. To the extent that such variations in methodology and resultant products are so drawn, it is intended that they fall within the ambit of protection provided by the subject claims.

Having set forth my invention in such clear and concise terms that those skilled in the art may readily understand and easily practice the invention, that which I claim is:

1. A method of producing photographic-print-quality image reproductions with a range of image contrast gradations throughout by etching comprising the steps of:
   selecting a base material having a surface suitable for etching;
   coating the etchable surface of the selected base material with photo resist;
   projecting light onto said photo resist coating by passing the light through a film photographic image selected to have sufficient image granularity to produce a comparatively coarse grained latent image in said photo resist coating relative to fine grain standards of the photographic arts;
   treating said photo resist coating to remove from the etchable surface of the selected base material all such photo resist except such as provides the desired etchant resistant latent image; and
   etching the etchable surface of said selected material to produce an etched photographic image on said etchable surface which image displays a range of image contrast dependent upon the degree of image granularity of the film photographic image utilized in first exposing said photo resist coating to light.

2. The method of claim 1 wherein the step of selecting said base material comprises the step of selecting a base material having a metallic substrate deposited thereon to provide a surface suitable for etching.

3. The method of claim 2 comprising the further step of selecting said base material from available transparent base materials and the step of etching said surface reveals said base material in selected areas of said etched photographic image.

4. The method of claim 3 comprising the further steps of:
   covering the etched surface of said metallic substrate with a protective material of a color contrasting with that of the metallic substrate; and
   viewing said etched photographic image through said transparent base material.

5. The method of claim 4 further comprising the step of selecting the metallic substrate deposited on the transparent base material to provide a mirror reflective interface between said transparent base material and said metallic substrate.

6. The method of claims 1 or 5 comprising the further step of selecting a film having a positive photographic image thereon through which film the step of projecting light onto said photo resist coating is performed.

7. The method of claim 2 comprising the further step of selecting said base materials from material of a color which contrasts with that of the metallic substrate and the step of etching said surface reveals said base material in selected areas of said etched photographic image.

8. The method of claim 1 wherein the step of selecting said base material comprises the step of selecting an etchable transparent base material.

9. The method of claim 8 comprising the further step of depositing a covering material over the etched photographic image to provide a background for said image when viewed through said etchable transparent base material.

10. The method of claim 9 wherein the step of depositing a covering material over the etched photographic image comprises the step of depositing a metallic substrate on said transparent base material over said etched photographic image to provide a mirror reflective interface between said transparent base material and said metallic substrate.

11. A manufacture comprising an etched photographic image having a range of image contrast gradations throughout produced by the method of claim 1.

12. A manufacture comprising an etched photographic image having a range of image contrast gradations throughout produced by the method of claim 3.

13. A manufacture comprising an etched photographic image having a range of image contrast gradations throughout produced by the method of claim 5.

14. A manufacture comprising an etched photographic image having a range of image contrast gradations throughout produced by the method of claim 7.

15. A manufacture comprising an etched photographic image having a range of image contrast gradations throughout produced by the method of claim 8.

16. A manufacture comprising an etched photographic image having a range of image contrast gradations throughout produced by the method of claim 9.

* * * * *